(12) United States Patent
Nakano et al.

(10) Patent No.: US 6,374,029 B1
(45) Date of Patent: Apr. 16, 2002

(54) OPTICAL DEVICE

(75) Inventors: Yoshiaki Nakano; Byong-Jin Ma, both of Tokyo (JP)

(73) Assignee: The University of Tokyo, Tokyo (JP)

( * ) Notice: Subject to any disclaimer, the term of this patent is extended or adjusted under 35 U.S.C. 154(b) by 15 days.

(21) Appl. No.: 09/586,756

(22) Filed: Jun. 5, 2000

(30) Foreign Application Priority Data

Jun. 8, 1999 (JP) ............................................. 11-160311

(51) Int. Cl.$^7$ ................................................. G02B 6/10
(52) U.S. Cl. ...................... 385/131; 359/344; 385/132; 385/14
(58) Field of Search ................................. 385/130, 131, 385/132, 14, 129, 8; 359/341, 342, 344

(56) References Cited

U.S. PATENT DOCUMENTS

| | | | | |
|---|---|---|---|---|
| 4,840,446 A | * | 6/1989 | Nakamura et al. | 385/96.13 |
| 5,459,799 A | * | 10/1995 | Weber | 385/2 |
| 6,208,795 B1 | * | 3/2001 | Nakano et al. | 385/131 |
| 6,271,961 B1 | * | 7/2001 | Emery et al. | 359/332 |

* cited by examiner

*Primary Examiner*—Cassandra Spyrou
*Assistant Examiner*—Christopher S. Maxie
(74) *Attorney, Agent, or Firm*—Venable; Robert J. Frank

(57) ABSTRACT

An optical device having a large extinction ratio and being suitable for the digital operation including first and second electrodes (7, 8) formed on both sides of a waveguide structure, respectively such that a carrier-injection region (3a) and a non-carrier injection regions (3b) are formed adjacent to each other in the waveguide structure. When mass carriers are stored in the carrier injection region, its refractive index is reduced lower than the non-carrier-injection regions. In this state, when a light wave with low optical power propagates through the carrier-injection region, since an amount of carriers consumed thereby is small, the refractive index of this region is still lower than the non-carrier-injection regions, and the input light wave is emitted sideways through the non-carrier-injection region. In contrast, when a light wave with high optical power propagates through the carrier-injection region, since the carrier consumption is large, the refractive index of this region (3a) becomes higher than the non-carrier-injection regions (3b), and the input light propagates through a waveguide which is optically induced to extend from the incident surface to the exit surface.

11 Claims, 6 Drawing Sheets

OPTICAL DEVICE

BACKGROUND OF THE INVENTION

1) Field of the Invention

The present invention relates to an optical device which can be preferably used as a resource in the wavelength division multiplex (WDM) optical communication system.

2) Description of the Related Art

In accordance with a recent abrupt progress in the digital communication, the development of the WDM optical communication system has been strongly required. This WDM optical communication system requires an optical wave converter in order to utilize a limited number of channels in an efficient manner by channel switching. In conventional wavelength converters, XGM type wavelength converters utilizing cross gain modulation and XPM type wavelength converters utilizing cross phase modulation are known.

In the XGM type optical wavelength converter, an intensity-modulated input optical signal having a wavelength $\lambda_1$, and an optical signal having a wavelength $\lambda_2$ and a constant amplitude are supplied to a semiconductor optical amplifier, and a polarity-inverted output optical signal having a wavelength $\lambda_2$, is produced by utilizing a difference in gain for an optical power impinging upon the semiconductor optical amplifier.

The XPM type wavelength converter utilizes the principle of Mach-Zehnder interferometer. In this type of device, an input side of a waveguide upon which an input optical signal having a wavelength $\lambda_2$ is divided into two waveguides, a semiconductor optical amplifier is arranged in one of the waveguides, and these two waveguides are set to be in-phase for light having a wavelength $\lambda_2$ to be modulated. When an input optical signal having a wavelength $\lambda_1$ and an optical signal having a wavelength $\lambda_2$ and a constant amplitude propagate, there is produced a phase difference of $\pi/2$ between the two waveguides due to the function of the input signal. By utilizing this phase difference, an inverted optical output having a wavelength $\lambda_2$ is generated.

Since the known XGM type wavelength converter utilizes the saturated gain of the optical amplifier, the extinction ratio of this optical waveguide converter is small.

In addition, it has inherent drawback that only the inverted optical output signal is produced and non-inverted output signal could not be produced.

In the XPM type optical wavelength converter, although it is possible to obtain a sufficiently large extinction ratio, since it reveals a periodical response, an extremely severer tolerance is required for a device length. Therefore, a through-put of the known XPM type optical wavelength converter is substantially reduced.

Furthermore, the above mentioned known optical wavelength converter is relative large in size. That is to say, the typical size of the known optical converter is not smaller than several to ten millimeters, and thus it is practically difficult to integrate it as a single chip.

SUMMARY OF THE INVENTION

It is therefore an object of the present invention to realize a novel and useful optical device which can overcome the aforementioned drawbacks and can have a large extinction ratio.

It is another object of the present invention to provide an optical device which can produce an non-inverted output signal and can operate in the digital manner.

It is still another object of the present invention to provide an optical device which can be manufactured by a relatively simple process and which can operate as a wavelength converter or a waveform shaper.

According to the invention, an optical device for converting an input optical signal into an optically amplified output optical signal comprising:

- a semiconductor substrate having mutually opposing first and second surfaces;
- a waveguide structure comprising a plurality of semiconductor layers formed on said first surface of the semiconductor substrate and having an incident surface upon which an input optical signal is made incident and an exit surface opposed to said incident surface, said incident and exit surfaces being perpendicular to the semiconductor layers;
- a first electrode formed on said second surface of the semiconductor substrate;
- a second electrode formed on the top of said waveguide structure such that the second electrode is opposed to said first electrode; and
- a DC bias source connected across said first and second electrodes such that carriers are injected into said waveguide structure for amplifying said input optical signal and an amplified output optical signal is emitted from said exit surface;
- wherein said semiconductor layers of the waveguide structure are composed of semiconductor materials whose refractive indices vary according to an amount of carriers injected from said first and second electrodes and stored therein;
- said first and second electrodes are formed such that a carrier injection region into which carriers are injected through the electrodes and a non-carrier-injection region into which carriers are not substantially injected are formed adjacent to each other in the waveguide structure; and
- said waveguide structure is constructed such that, in a carrier injection operation state, when an input optical signal of a first power level propagates through the waveguide structure, a refractive index of the carrier injection region becomes higher than that of the non-carrier-injection region and the carrier injection region constitutes an optical waveguide which guides input light wave from said incident surface to said exit surface, and when an input optical signal of a second power level lower than the first power level propagates through the waveguide structure, a refractive index of the carrier injection region is kept lower than that of the non-carrier-injection regions and the input optical signal is emitted through said non-carrier-injection.

The present invention positively utilizes the optical amplification effect and the free carrier plasma effect in which a refractive index of a semiconductor material is in inverse-proportion to a concentration of carriers injected in the material and stored therein. The first and second electrodes are arranged such that the carrier injection region into which carriers are injected through the electrodes and the non-carrier-injection regions into which carriers are not substantially injected are formed adjacent to each other in the waveguide structure. When mass carriers are injected into the carrier-injection region through the electrodes, these mass carriers are stored in this region and the refractive index of this region is reduced relatively lower than that of the adjacent non-carrier-injection region. However, when the light wave propagates through the waveguide structure, the carriers stored in the carrier-injection region are consumed and the carrier concentration of the waveguide is decreased. The decrease in carrier concentration causes in turn a relative increase in the refractive index of this region higher than that of the adjacent non-carrier-injection regions. In addition, since an amount of consumed carriers substantially corresponds to a power level of the propagating light wave, the propagation of a light wave having a higher power level causes a further decrease in the carrier concentration of the carrier-injection region and thus the refractive index of this region to be significantly higher than that of the adjacent non-carrier-injection regions, thereby further enhancing the optical confinement effect. This results in that there is formed in the waveguide structure a propagation path for the optical signal with a higher refractive index than that of the surrounding medium. Once such a propagation path is formed, the optical confinement effect and the induced emission generated in the waveguide are further enhanced, which induces a state of positive feedback. Therefore, this type of waveguide is referred as an "optically induced waveguide".

Conversely, when a signal light having a low power level propagates through the waveguide structure, since the amount of the carriers consumed by the optical amplifying function is rather small, a mass of carriers are still remained in this region, with the refractive index of this region being kept low. As the refractive index of this region is relatively lower than that of the adjacent non-carrier-injection regions, the signal light having a low power level is absorbed by the adjacent region having a relatively high refractive index and is radiated through the region.

The present invention is based on the aforementioned understanding. According to the invention, the waveguide is switched according to the power level of the input optical signal between a guiding mode in which the input optical signal is guided through the waveguide to the exit surface and an anti-guiding mode in which the input optical signal is emitted through the non-carrier-injection regions. Utilizing this mode switching, a wavelength converter and a waveform shaper can be realized with a simple manufacturing process.

According to the present invention, a nonlinear input/output characteristic can be obtained by utilizing the free carrier plasma effect and the optical amplification effect. That is, when the power level of the input signal light is low, almost all input light is absorbed by the non-carrier-injection region and consequently the amount of the carriers consumed by the optically amplifying function is very small. Although the increase of the power level of the input optical signal causes the amount of the carrier consumption in the waveguide to be increased, the anti-guiding mode is still maintained as long as the refractive index of the waveguide remains lower than the refractive index of adjacent non-carrier-injection regions, allowing only a little signal light to be transmitted up to the exit surface. When the refractive index of the waveguide becomes to substantially equal to that of the non-carrier-injection regions because of the increased carrier consumption, the guiding effect is abruptly generated such that the input optical signal can propagate through the waveguide to the exit surface. This propagation of the signal light of a higher power level abruptly enhances the optical amplification effect to emit the optically amplified optical signal. As a result, a nonlinear input/output characteristic with a threshold value can be obtained, which could never be obtained by conventional semiconductor optical amplifiers. Owing to this nonlinear input/output characteristic, the optical device of the invention can act in a digital manner.

More important fact is that the optical device of the present invention outputs "high" signal light for "high" input signal light, and also outputs "low" signal light for "low" input signal light. This results in that a non-inverted output optical signal can be produced.

By utilizing the nonlinear input/output characteristic of the present invention, the optical devices with various functions can be realized. For example, by supplying an optical signal having a wavelength $\lambda_1$, together with a continuous wave having a wavelength $\lambda_2$, an optically amplified signal light having a wavelength $\lambda_2$ and modulated according to the signal light having the wavelength $\lambda_1$ can be output. This realizes a wavelength converter having a function of optical amplifier with a simple construction.

Also, by supplying a weak optical signal having a wavelength $\lambda_1$ and a continuous wave having the same wavelength, the output optical signal which is optically amplified and has a high S/N ratio can be obtained. In contrast, conventional semiconductor optical amplifiers cannot obtain an output optical signal having a high S/N ratio, because "high" signal components and "low" signal components in the input optical signal are both equally amplified, that is, noise components are equally amplified. In this manner, the present invention has a special functional effect which cannot be achieved by conventional semiconductor optical amplifiers.

DETAILED DESCRIPTION OF THE PREFERRED EMBODIMENTS

Figure 1:
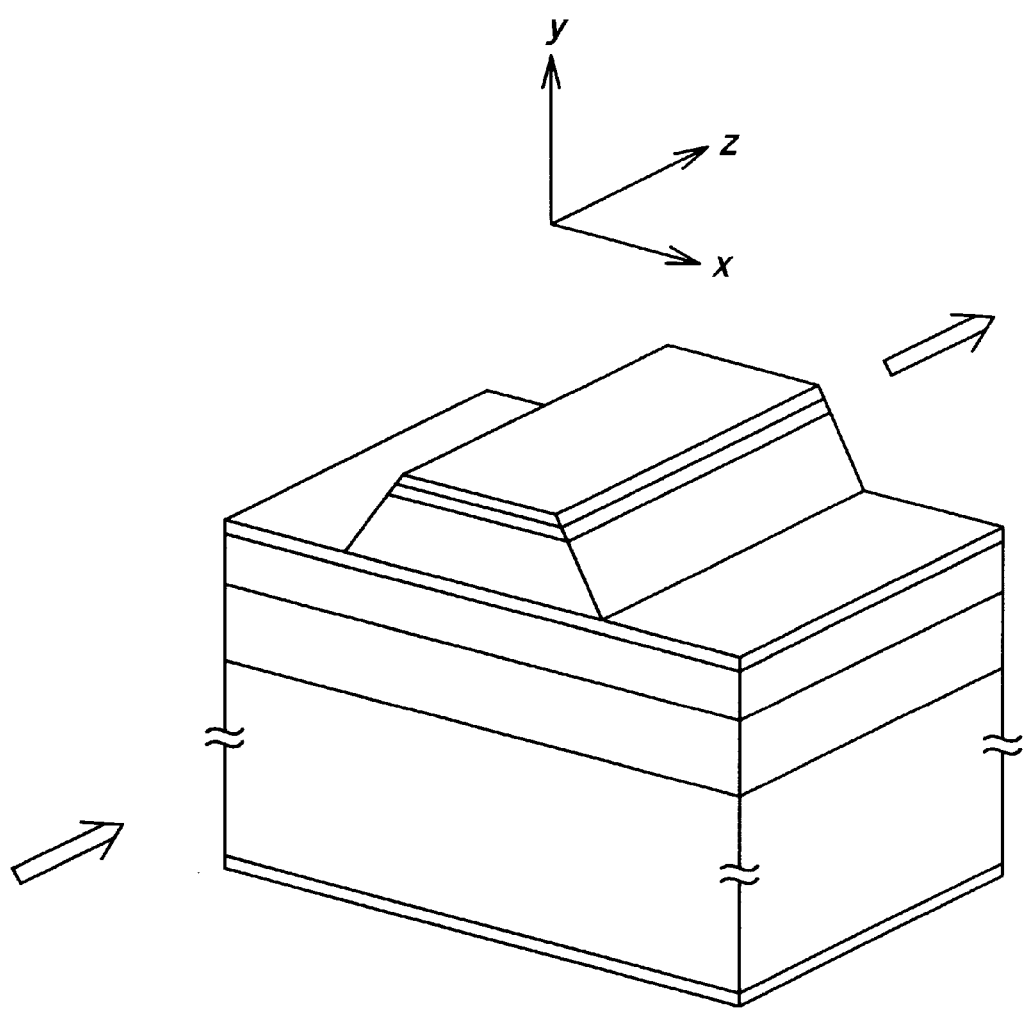
FIG. 1 is a schematic perspective view showing the construction of an example of the optical device according to the present invention.
Figure 2A:
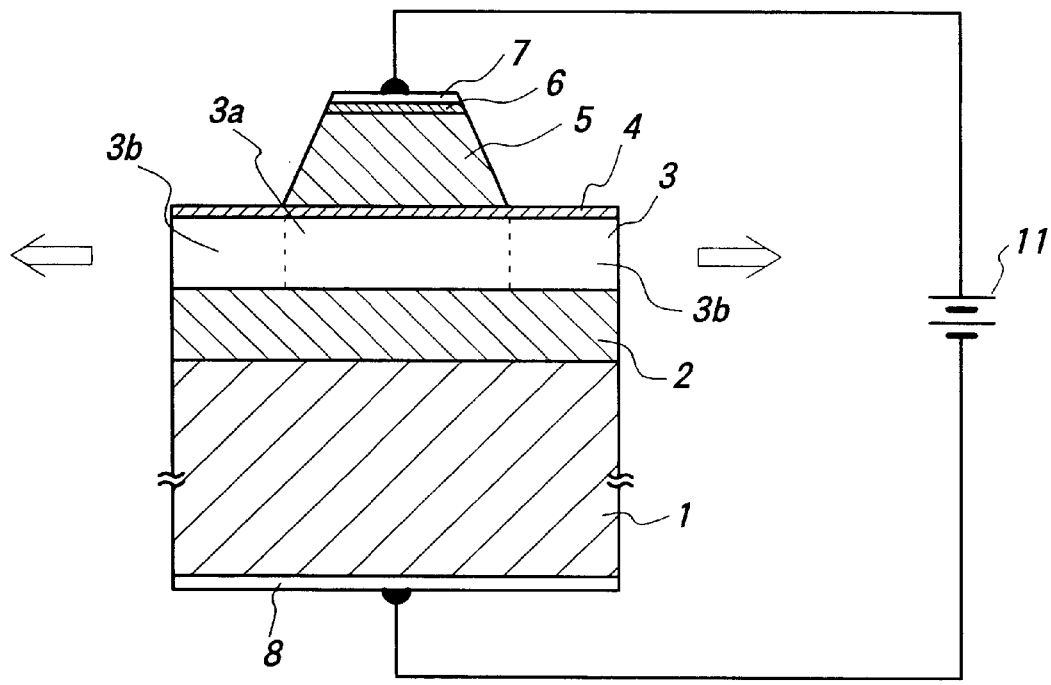
FIGS. 2A, 2B are sectional views of the optical device of FIG. 1 taken along a lane perpendicular to the direction of the light wave propagation and a plane parallel to the direction of the light wave propagation.
Figure 2B:
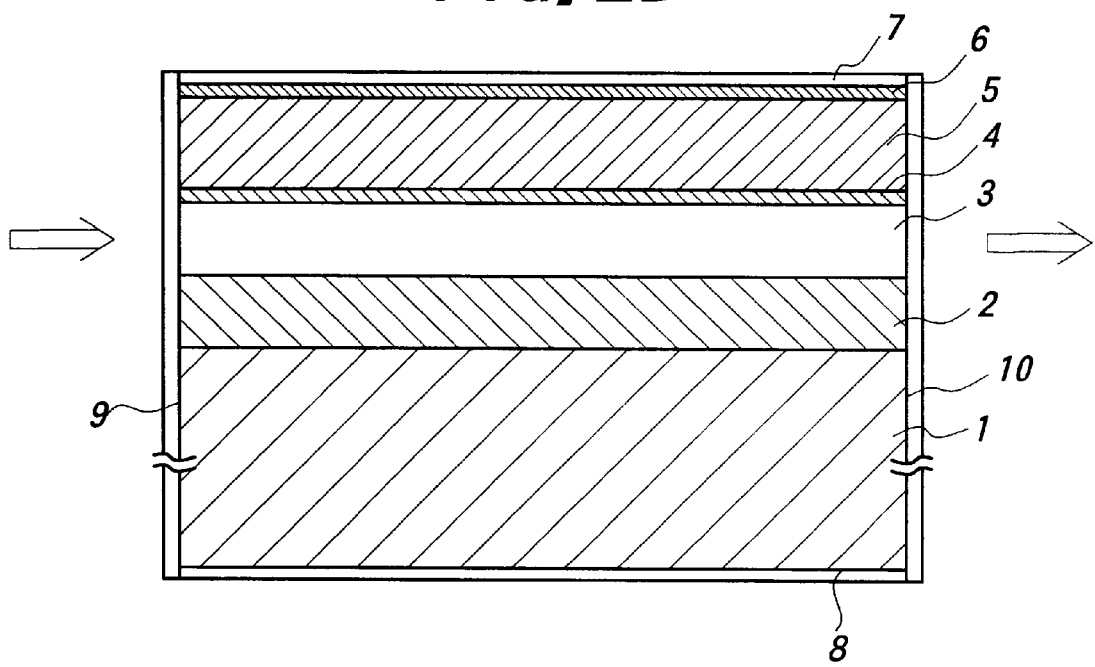

FIG. 1 and FIGS. 2A, 2B show an embodiment of the optical device according to the present invention. FIG. 1 is a perspective view general construction of the optical device. FIG. 2A is a schematic sectional view taken along a plane perpendicular to the direction of the light wave propagation, and FIG. 2B is a schematic sectional view taken along a plane parallel to the direction of the light wave propagation. As shown in FIG. 1, the direction of the light wave propagation is indicated as z direction, the direction of semiconductor layers stacking and carrier injection as y direction, and the direction perpendicular to the directions of the light wave propagation and the carrier injection as x direction.

In the preset embodiment, the optical device comprises a semiconductor substrate 1 of a first conductivity type made of n-InP, and a wave-guide structure is formed on the semiconductor substrate. The substrate 1 has a thickness of 100 $\mu$m and an impurity concentration of $2 \times 10^{18}$ atoms/cm.

The substrate 1 contains Sulfur as n-type impurity. A first cladding layer 2 is formed on the substrate 1, said first cladding layer having a thickness of 0.4 μm and being made of n-InP having an impurity concentration of $5 \times 10^{17}$ atoms/cm$^3$. On the first cladding layer 2, is formed an active layer 3 of i-InGaAsP (1.55 μm) having a thickness of 0.2 μm. An etching stopper layer 4 of InGaAsP (1.25 μm) is formed on the active layer with a thickness of 0.02 μm. On the etching stopper layer 4 is formed a second cladding layer 5 of a second conductivity type. This second cladding layer 5 has a thickness of 0.4 μm and an impurity concentration of $5 \times 10^{17}$ atoms/cm$^3$. P-type impurity may be Zn. On the second cladding layer 5 is formed, a cap layer 6 having a thickness of 0.1 μm and an impurity concentration of $2 \times 10^{19}$ atoms/cm$^3$, on which a second electrode 7 of Ti—Au is formed. Finally, a first electrode 8 of Ti—Au is formed on an opposite surface of the substrate 1.

Now a method of manufacturing the above mentioned optical device will explained briefly. After forming the second cladding layer 5, the second cladding layer is selectively removed by photolithography while the layer 4 is used as an etching stopper, leaving the portions corresponding to ridge parts of a semiconductor optical amplifier, thereby forming a ridge type waveguide structure. Then, a cap layer 6 and a second electrode layer 7 are formed. By patterning process, the second electrode 7 is formed on the ridge portion of the semiconductor optical amplifier. Then, the first electrode 8 are formed on the rear surface of the semiconductor substrate 1 in the same manner. Finally, as shown in FIG. 2B, anti-reflection coatings are formed on a light incident end surface 9 and a light exit end surface 10 of the semiconductor optical amplifier respectively. An input side optical fiber (not shown) is arranged to face the light incident end surface 9 such that the signal light is made incident upon the waveguide structure through the input optical fiber. And, an output side optical fiber (not shown) is arranged to face the light exit end surface 10 so that an optically amplified light wave is emitted through the output optical fiber.

A DC bias source 11 is connected between the first electrode 8 and the second electrode 7. From the DC bias source 11, carriers are continuously injected into the central portion 3a of the active layer 3 at a constant rate. Electrons are injected into the central portion 3a of the active layer 3 through the first electrode 8, the n-type semiconductor substrate 1, and the n-type first cladding layer 2. Holes are injected into the active layer 3 through the second electrode 7, the cap layer 6, the second clad layer 5, and the etching stop layer 4. The thus injected carriers are stored within the central portion 3a of the active layer 3. Therefore, as shown in FIG. 2A, a carrier injection region 3a into which carriers are injected and stored is formed at the center of the active layer 3, and non-carrier injection regions 3b into which carriers are substantially not injected are formed on both sides of the carrier-injection region viewed in the propagating direction of the input optical signal.

Now a refractive index of the waveguide structure will be explained. The intrinsic InGaAsP constituting the active layer 3 has a refractive index of about 3.50 and the InP constituting the first and second cladding layers 2 and 5 has a refractive index of about 3.20. Therefore, the refractive index of the active layer 3 is larger than that of the first and second cladding layers adjacent to the active layer viewed in the y direction such that the light wave propagating along the waveguide structure is confined in the y direction and is guided along the waveguide.

Figure 3A:
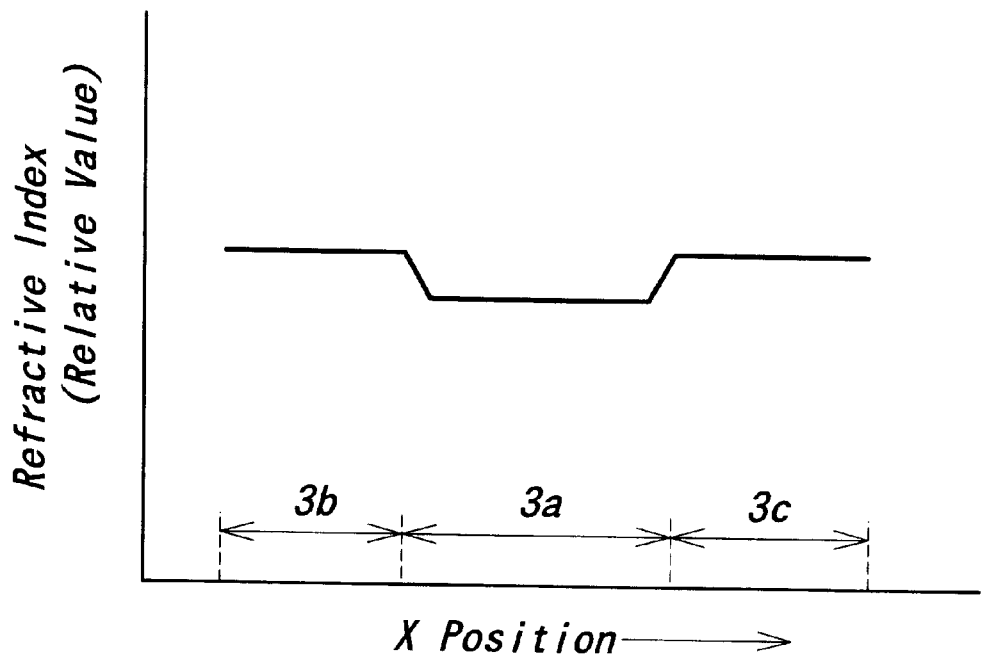
FIGS. 3A, 3B are graphs illustrating the relation between the location in a x direction and the refractive index.
Figure 3B:
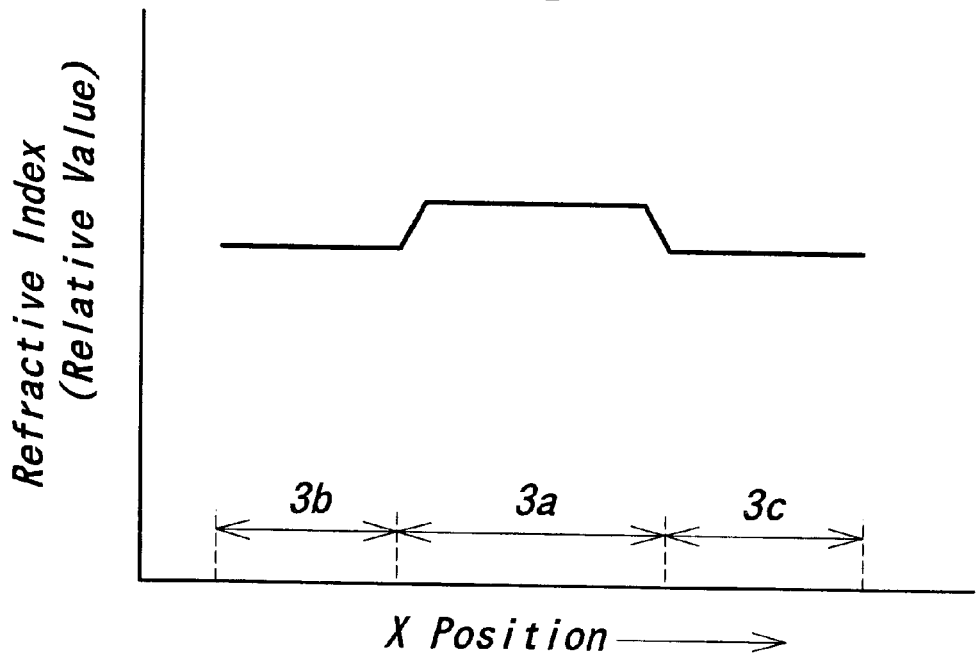

Next, the optical confinement effect as well as the radiation effect for the input optical signal in the x direction will be described. As shown in FIG. 2B, when the input optical signal is applied to the incident end surface 9, this light wave propagates along the z direction in the waveguide structure composed of the first cladding layer 2, the active layer 3, and the second clad layer 5. During the propagation through the waveguide structure, the light wave is optically amplified by carriers stored in the carrier injection region 3a of the active layer 3. When a power level of the input optical signal is low, an amount of carriers which are consumed by the amplifying function becomes small and an amount of carriers remained in the carrier-injection region 3a of the active layer 3 is relatively increased, and therefore a refractive index of the waveguide with respect to the propagating wave is relatively decreased. Contrary to this, when a power level of input optical signal is high, a large amount of carriers are consumed by the optically amplifying function, thereby an amount of carriers remained in the active layer is substantially reduced. Therefore, a refractive index of the active layer is abruptly increased. As a result, the refractive index of the waveguide with respect to the propagating light wave is relatively increased. This state will be explained with reference to FIGS. 3A and 3B. FIGS. 3A and 3B are graphs schematically illustrating relations between the refractive index and location in the x direction in a plane perpendicular to the z direction which is the propagation direction of the signal light. FIG. 3A shows a relation between the refractive index and location in the x direction when signal light having a low power level propagates along the waveguide, and FIG. 3B sows the relation when signal light having a high power level propagates. The refractive index of intrinsic InGaAsP constituting the active layer 3 in a state that the carriers are not forced to be injected, that is, a refractive index of the non-carrier-injection regions 3b is about 3.26. Meanwhile, when carriers are forced to be injected, a refractive index of the carrier injection region 3a is decreased to, for example about 3.258. Therefore, a refractive index of the carrier injection region as defined by the ridge type waveguide becomes lower than that of the surrounding non-carrier-injection regions 3b, thereby refractive index profile shown in FIG. 3A is obtained. When optical signal having a high power level is supplied, a quite large amount of carriers are consumed by the optically amplifying function, causing the amount of the carriers stored in the carrier-injection region 3a of the active layer 3 to be decreased. While an amount of carriers in the non-carrier-injection regions 3b are kept substantially constant. As a result, a refractive index of the carrier injection region 3a is increased to about 3.262 and becomes higher than that of the surrounding non-carrier-injection regions, as shown in FIG. 3B.

As described above, when an input optical signal having a low power level is supplied, a refractive index of the propagation path of the light wave is lower than that of the adjacent side regions 3b. Owing to such a difference in refractive index, the light wave of the input signal is absorbed by the non-carrier-injection regions having a higher refractive index and is emitted to the exterior through the surrounding regions. This results in that the optical device operates in the anti-guiding mode, and negligibly weak light is emitted from the output surface. In contrast, when an input optical signal having a high power level is supplied, a refractive index of the propagation path becomes higher than that of the non-carrier-injection regions 3b. This difference in refractive index gives rise to the optical confinement effect, forming a waveguide extending from the incident surface 9 to the exit surface 10. Thus, the optical confinement effect occurs both in the x and y directions, and the amplified light wave is confined both in the x and y directions and propagates through the waveguide and is emitted from the exit surface 10.

Figure 4A:
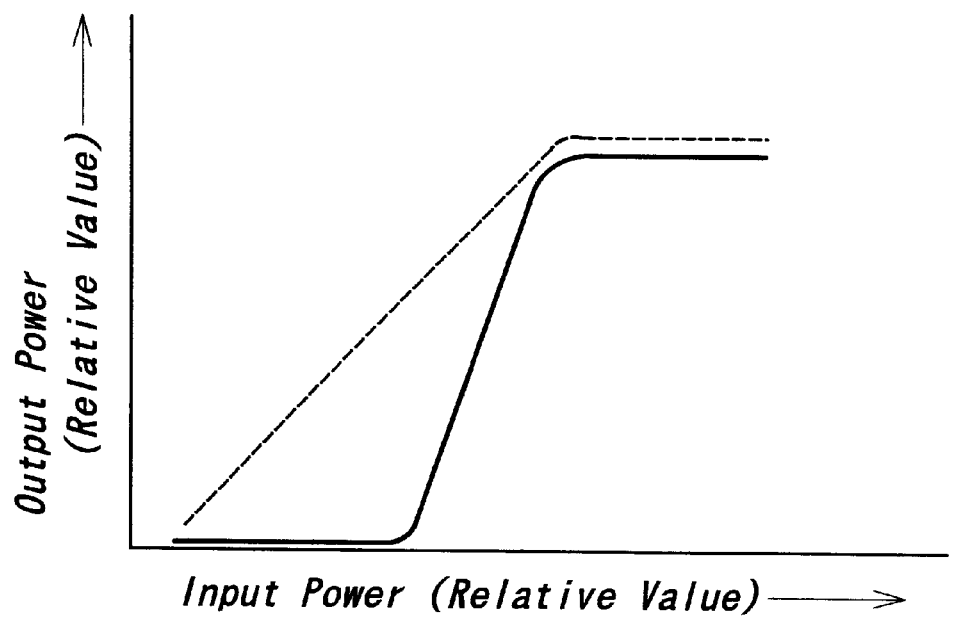
FIGS. 4A, 4B are graphs illustrating the relations between the output power an the gain and the input power, respectively.
Figure 4B:
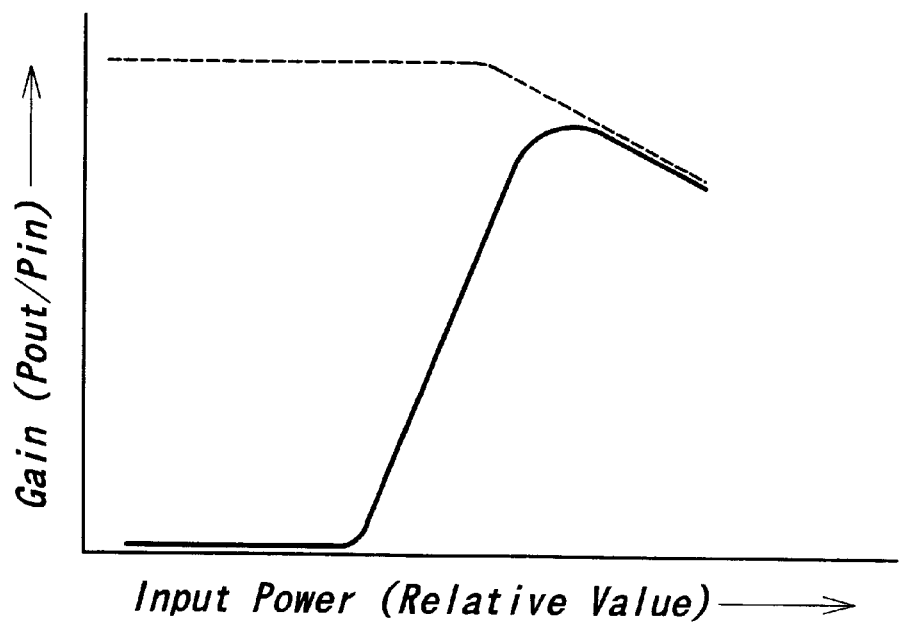

FIGS. 4A and 4B are graphs schematically illustrating the relation between the input power and the output power and also the relation between the input power and the gain (Pout/Pin) when the optical signal propagates in the aforementioned optical device. In FIG. 4A, the horizontal axis represents an input power of the optical signal and the vertical axis represents an output power. The optical device according to the present invention has both the optical amplifying function and index guiding function. When an input power of the input optical signal is low, the index guiding function does not act and almost all optical power of the input optical signal is radiated from sideways and is not emitted from the exit surface. Thereby, this optical device acts in the anti-guiding mode. Furthermore, in case that a refractive index of the carrier injection region is relatively lower than that of the surrounding regions, an output power hardly changes in spite of the increase in the input power. Conversely, when an input power is increased and a refractive index of the carrier injection region exceeds that of the non-carrier-injection regions, the index guiding effect abruptly appears and the input optical signal begins to propagate in the carrier injection region. By this propagation of the signal light, the optically amplifying function is abruptly enhanced and the output power is sharply increased relative to the input power. Thus, as shown in FIG. 4A, a nonlinear input/output characteristic with a threshold value can be obtained owing to the multiplier effect of the index guiding effect and the optical amplification effect. As a reference, the relation between input power and the output power in the common semiconductor optical amplifier is shown by broken line. In conventional semiconductor optical amplifiers, a refractive index of the carrier-injection region is set to be higher than that of the surrounding regions both in the x and y directions at the manufacturing stage, and thus the output power is linearly increased in accordance with the input power.

In FIG. 4B, the horizontal axis represents the input power and the vertical axis represents the gain (Pout/Pin). A solid line indicates a characteristic of the optical device according to the present invention and a broken line denotes a general characteristic of a conventional semiconductor optical amplifier. In the optical device according to the present invention, the optical amplification hardly occurs when the power level of the input optical signal is low level. However, when the input power further increases and a refractive index of the carrier injection region approaches to that of the non-carrier-injection regions, both of the guiding function and the optical amplifying function significantly appears and the optical amplification effect abruptly increases. After exceeding the carrier injection limit of the DC current source, the gain is gradually decreased. On the contrary, since the gain of the conventional optical semiconductor amplifier is set constant irrespective of the input power, the gain is kept to be constant in spite of the increase in the input power and is decreased gradually after exceeding the carrier-injection limit. As is seen from the gain characteristics of FIG. 4B, the optical device according to the present invention has a specific gain characteristic which is different from that of the known semiconductor optical amplifiers. As described above, the optical device according to the present invention has a threshold characteristic which cannot be obtained by a conventional semiconductor optical amplifier, and various optical devices can be realized by utilizing this special threshold characteristic.

Figure 5:
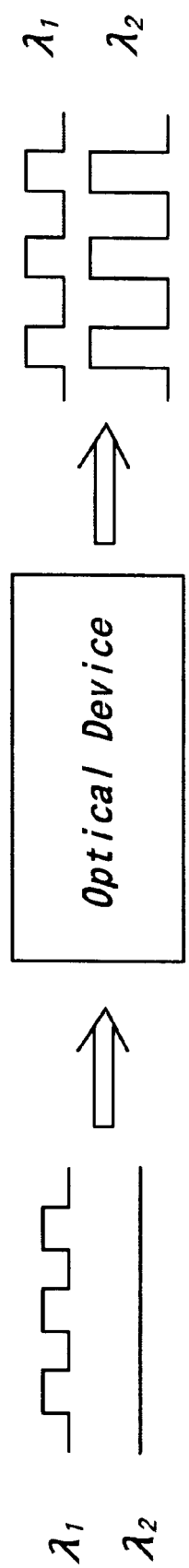
FIG. 5 is a schematic view of a wavelength converter according to the invention.

Now, an embodiment of the optical device according to the present invention applied to the wavelength converter will be explained. As shown in FIG. 5, an input optical signal having a wavelength $\lambda_2$ and light wave having a wavelength $\lambda_2$ and a constant amplitude are made incident upon the optical device according to the present invention. A power level of the light wave having wavelength $\lambda_2$ and constant amplitude is set at a value a little lower than the threshold value shown in FIGS. 4A and 4B. When a power level of the optical signal with the wavelength $\lambda_1$ is high, a high level optical signal is made incident on the optical device and thus both of the light waves with wavelengths of $\lambda_1$ and $\lambda_2$ are optically amplified and are emitted as a high level signal. On the contrary, when a power level of the optical signal with the wavelength $\lambda_1$ is at a low level, the optical device operates as the anti-guiding mode and both light waves of $\lambda_1$ and $\lambda_2$ are not amplified, thereby both of light waves are emitted as a low level signal. As a result of this, an amplified optical signal with the wavelength $\lambda_2$ modulated according to the input optical signal can be emitted from the exit end surface.

Figure 6:
FIG. 6 is a schematic view of a waveform shaper according to the invention.

FIG. 6 shows an embodiment of the optical device according to the present invention constructed as the waveform shaper. An input optical signal having a wavelength $\lambda_1$ and a light wave having the same wavelength and a constant amplitude are supplied to the optical device according to the present invention. A power level of the light wave having constant amplitude is set at a value a little lower than the threshold value shown in FIGS. 4A and 4B. When the input optical signal is at a high level, the device operates in the guiding mode and emits an optically amplified high level light signal. When the input optical signal is at a low level, a low level signal is output, because the power level of the input light wave is lower than the threshold value. As a result, the optical device according to the present invention can operate as the waveform shaper. This waveform shaper can be favorably used to optically amplify a weak input signal and generate an output signal having a high S/N ratio. That is to say, when only a weak optical signal is supplied to the optical device, such weak optical signal cannot be amplified. However, when the optical signal of weak power and the light wave with relatively high constant amplitude are both supplied to the optical device, the optical power of the input light wave can be increased up to the threshold value and thus an output optical signal having significantly increased amplitude and a high S/N ratio can be obtained by utilizing the threshold characteristic of the optical device. In addition, the optical device shown in FIG. 6 can function as the waveform shaper by supplying only the input optical signal light. Also in this case, the output optical signal having high S/N ratio can be regenerated, because noise components with low power level can be removed as well as the wave distortion.

The present invention is not limited to the aforementioned embodiments and various alternations and modifications may be conceived by those skilled in the art within the scope of the invention defined by claims. For instance, the material systems constituting the waveguide structure is not limited to InGaAs/InP system but semiconductor systems such as GaAlAs/GaAs system, InGaAlAs/InP system, and InGaAs/GaAs system may be employed.

Also, a quantum well structure may be used as the active layer. In this case, for example a first optical confinement layer of InGaAsP (1.55 μm) having a thickness of 200 nm is formed on the first cladding layer. On this optical confinement layer, a quantum well structure composed of 5 sets of a quantum well layer of alternative InGaAsP (1.75 μm)

having a thickness of 10 nm and a barrier layer of InGaAsP (1.25 μm) having a thickness of 10 nm is formed. On this quantum well structure, a second optical confinement layer of InGaAsP (1.25 μm) having a thickness of 200 nm is formed. This quantum well structure can be used as an active layer.

What is claimed is:

1. An optical device for converting an input optical signal into an optically amplified output optical signal comprising:

a semiconductor substrate having mutually opposing first and second surfaces;

a waveguide structure comprising a plurality of semiconductor layers formed on said first surface of the semiconductor substrate and having an incident surface upon which an input optical signal is made incident and an exit surface opposed to said incident surface, said incident and exit surfaces being perpendicular to the semiconductor layers;

a first electrode formed on said second surface of the semiconductor substrate;

a second electrode formed on the top of said waveguide structure such that the second electrode is opposed to said first electrode; and a DC bias source connected across said first and second electrodes such that carriers are injected into said waveguide structure for amplifying said input optical signal and an amplified output optical signal is emitted from said exit surface;

wherein said semiconductor layers of the waveguide structure are composed of semiconductor materials whose refractive indices vary according to an amount of carriers injected from said first and second electrodes and stored therein;

said first and second electrodes are formed such that a carrier injection region into which carriers are injected through the electrodes and a non-carrier-injection region into which carriers are not substantially injected are formed adjacent to each other in the waveguide structure; and said waveguide structure is constructed such that, in a carrier injection operation state, when an input optical signal of a first power level propagates through the waveguide structure, a refractive index of the carrier injection region becomes higher than that of the non-carrier-injection region and the carrier injection region constitutes an optical waveguide which guides input light wave from said incident surface to said exit surface, and when an input optical signal of a second power level lower than the first power level propagates through the waveguide structure, a refractive index of the carrier injection region is kept lower than that of the non-carrier-injection regions and the input optical signal is emitted through said non-carrier-injection.

2. An optical device according to claim 1, wherein on both sides of the carrier injection region viewed in a light propagating direction, there are arranged non-carrier-injection regions, and said input optical signal having the second power level is emitted through these non-carrier-injection regions into both sides of the optical device.

3. An optical device according to claim 2, wherein said waveguide structure is constructed as a ridge type waveguide structure.

4. An optical device according to claim 1, wherein said semiconductor substrate is of a first conductivity type, and said waveguide structure comprises a first cladding layer of a first conductivity type formed on the semiconductor substrate, an active layer formed on the first cladding layer and for storing the injected carriers, and a second cladding layer of a second conductivity type formed on the active layer.

5. An optical device according to claim 2, wherein a refractive index of a semiconductor material of the active layer is larger than that of a semiconductor material of said first and second cladding layers.

6. An optical device according to claim 5, wherein said active layer is composed of InGaAsP, and said first and second cladding layers are composed of InP.

7. An optical device according to claim 1, wherein anti-reflective coatings are formed on said incident and exit surfaces, respectively.

8. An optical device according to claim 1, wherein said optical device operates as a wavelength converter which receives at the incident surface an input optical signal having a first wavelength $\lambda_1$ and a light wave signal having a constant amplitude and a second wavelength $\lambda_2$ which is different from $\lambda_1$, and emits an output optical signal having the second wavelength $\lambda_2$ and having an intensity modulated in accordance with said input optical signal.

9. An optical device according to claim 1, wherein said optical device operates as a waveform shaper which receives at the incident surface an input optical signal to be optically amplified and a light wave signal having a constant amplitude and the same wavelength as the input optical signal, and emits an output optical signal whose waveform is shaped in accordance with a power level of said input optical signal.

10. An optical device according to claim 1, wherein said optical device operates as a waveform shaper which receives at the incident surface an input optical signal to be optically amplified, and emits an output optical signal having a waveform shaped in accordance with a power level of the input optical signal and having a high S/N ratio.

11. An optical device according to claim 9, wherein said constant amplitude of said light wave signal is larger than that of the input optical signal.

* * * * *